United States Patent [19]

Raven et al.

[11] Patent Number: 5,734,668
[45] Date of Patent: Mar. 31, 1998

[54] LASER DIODE DRIVE CIRCUIT

[75] Inventors: Anthony Raven, Royston; Robin Michael Lee, Linton, both of England

[73] Assignee: Diomed Limited, Cambridge, England

[21] Appl. No.: 411,596

[22] PCT Filed: Sep. 10, 1993

[86] PCT No.: PCT/GB93/01915

§ 371 Date: Jun. 5, 1995

§ 102(e) Date: Jun. 5, 1995

[87] PCT Pub. No.: WO94/08370

PCT Pub. Date: Apr. 14, 1994

[30] Foreign Application Priority Data

Oct. 7, 1992 [GB] United Kingdom ............ 9221104

[51] Int. Cl.$^6$ ............................................. H01S 3/00

[52] U.S. Cl. ................................................ 372/38

[58] Field of Search ..................................... 372/38

[56] References Cited

FOREIGN PATENT DOCUMENTS 1362390  9/1971  United Kingdom.

*Primary Examiner*—Brian Healy
*Assistant Examiner*—Robert E. Wise
*Attorney, Agent, or Firm*—Alix, Yale & Ristas, LLP

[57] ABSTRACT

The lasing output of a laser diode (1) is controlled by the current through the diode (1). The laser diode (1) is driven by a switched mode drive circuit in which a pulsed signal is applied to a smoothing circuit, typically including a capacitor C and an inductor L, arranged to provide a smoothed output voltage whose magnitude depends on the pulse width of the drive signal.

15 Claims, 3 Drawing Sheets

LASER DIODE DRIVE CIRCUIT

BACKGROUND OF THE INVENTION

1. Field of the Invention

The present invention relates to a drive circuit for a laser diode.

2. Description of the Prior Art

The lasing output of a laser diode is controlled by the current through the diode.

JP-A-61 256 682 discloses a system for driving a laser diode irrespective of the polarity of the diode by separating the light output control circuit of the diode and the diode in a DC manner.

Previously, laser diodes have been driven by linear control circuits as shown in FIG. 1 of the instant application. Such a system is disclosed in e.g. Melles Griot Optics Guide 5, Chapter 20, page 29 (Power Supply Design (1990)).

In the prior art drive circuit of FIG. 1, an external control signal indicative of the desired lasing output of a diode 1 is applied, via an operational amplifier 3, to a transistor 2 which acts as a variable resistance connected in series with another resistor to vary the current through the diode 1 to produce the required coherent light emission output power. The output of the diode is detected by a photodetector and a signal commensurate therewith is fed back to the other input of the op-amp 3 where it is compared to the external control signal and the difference is used to adjust the current through the laser diode, so as to minimise the error between the actual and desired output values. Thus, in such drive circuits the laser diode current and voltage are controlled by the transistor 1 in accordance with the external control signal and the feedback signal, and the remaining voltage from the direct current supply bus is dropped across the series elements (the transistor and the resistor).

We have found that these known drive circuits for laser diodes are not, however, very efficient. Typically, at full power, the laser diode has approximately 2V across it and a current of 0.5 A. With, for example a 5V power supply, 3V would therefore be dropped across the transistor and resistor, i.e. a power loss of 1.5 W. Thus, of the 2.5 W used, only 1 W gets used by the laser diode which is very inefficient.

Further, since such a large amount of power is dissipated as heat in the series elements, large heat sinks are required. This results in a bulky circuit.

The above problems are most significant where a light source is provided with a plurality of laser diodes whose light beams are combined to provide a power output substantially higher than that available from a single diode. For example, WO-92/02844, describes a bank of e.g. sixteen laser diodes arranged in a portable light source for an optical fibre such as a body implantable probe or retina laser treatment fibre. In such a device sixteen drive circuits must be provided in a compact unit and it is, therefore, important that the circuits be as efficient and compact as possible.

Another problem with known linear laser diode drive circuits arises when it is necessary to switch the diode off. Since most op-amps have slight offsets and tolerance mismatches, an external control signal of zero volts will often result in a small amplifier output signal and this signal may be sufficient to cause the laser diode to still be activated to provide a very low power output. In practice, in order to overcome this problem, a negative external control signal is used when zero output is required. However, this is not ideal and leads to difficulties when a very low output or precise control is required.

Thus, known laser drive circuits as shown in FIG. 1 are typically only 30 to 40% efficient or less, and therefore require a higher power input and, due to the power loss through the transistor and resistor, large heat sinks are required resulting in a large bulky circuit. Such circuits are particularly unsuitable for use in applications such as disclosed in WO-92/02844 where the size of the elements is an important consideration.

SUMMARY OF THE INVENTION

It is, therefore, an object of the preferred embodiment of the present invention to provide a compact laser diode drive circuit whereby electrical power losses are minimised and precise control of the laser, even at very lower power levels or zero output, is possible.

In order to achieve the foregoing object the present invention uses a switched mode drive circuit to drive a laser diode. Accordingly, viewed from a first aspect, the invention provides a drive circuit for a laser diode characterised in that said drive circuit comprises a switched mode drive circuit electrically connected to said laser diode, wherein a pulsed drive signal is applied to said switched mode drive circuit and a smoothing circuit provides a smoothed output voltage whose magnitude depends on the pulse width of the drive signal.

Viewed from a further aspect, the invention provides a method of driving a laser diode characterised by comprising the use of a switched mode drive circuit, said switched mode drive circuit comprising a smoothing circuit, to which a pulsed drive signal is applied, arranged to provide a smoothed output voltage whose magnitude depends on the pulse width of the drive signal.

The invention extends to a light source unit for use in conjunction with an optical fibre, comprising a plurality of laser diodes, optical means for combining the light beams produced by the diodes and for directing the combined beam into an optical fibre, wherein each laser diode is driven by a switched mode drive circuit contained in said unit.

While various types of switched mode drive circuits were previously known, such circuits have never been used to drive laser diodes.

A switched mode drive circuit as referred to herein is a circuit in which a pulse width modulated input signal results, due to the employment of a smoothing circuit typically including a capacitor and an inductor, in a smoothed, i.e., substantially constant level, diode control voltage whose magnitude depends on the pulse width of the input signal.

Switched mode drive circuits have a much greater thermal efficiency when compared to a circuit of FIG. 1 and, since excess voltage is not dropped across an element in series with the diode resulting in power being dissipated as heat, no bulky cooling elements are required thus allowing the circuit to be much smaller.

A further advantage of the use of a switched mode drive circuit in accordance with the present invention is that the laser diode can be switched off precisely in response to a zero power external control signal, i.e., with no drive pulses there can be no current flowing in the laser diode. Restated, the operation of the laser diode is not affected by voltage offsets.

The use of high frequency switching is preferred and allows the inductor in the smoothing circuit to be small both in size and value thus having only a small energy storage capability. Once the input power to the drive circuit is switched off, the laser's ability to continue lasing depends on the energy storage of the inductor. Therefore, the smaller the inductance the quicker the laser will stop lasing in response to a zero command signal input. This is particularly advantageous in medical apparatus since it is a standard requirement of all electrical medical equipment that if a failure is detected the apparatus must react quickly to being switched off.

It is also a requirement that medical products comply with an international standard (IEC 601) which requires that the system must not become hazardous by reason of any one component failing, and so additional safety measures must be included to prevent this.

In the linear supply shown in FIG. 1, if the transistor fails, a short circuit between the diode and the resistor would result in an increase in current through the series circuit thereby causing the diode to operate at a higher output power level. Unless this destroys the diode (which is also undesirable) the high power output is potentially hazardous to the patient. Until now, in order to comply with the regulation, additional safety monitoring elements have been added to the drive circuit to avoid this problem but this all adds to the overall size, complexity and cost of the package.

Thus, in a particularly preferred embodiment the present invention comprises an isolating transformer, preferably a step down transformer, isolating the driving end of the circuit from the smoothing circuit and laser diode. A suitable circuit is a Buck step-down isolated, push-pull converter. An isolating transformer enables the apparatus to be made intrinsically safe against single component failure without the need for additional safety measures.

The use of a step-down transformer also increases the efficiency of the circuit and minimises power losses.

Previously, switched mode voltage supplies have been used to provide standard 5 or 12V supply voltages. However, in driving a laser diode the voltage requirement is much less than this, usually around 2V.

It has been found, however, the efficiency of switched mode drive circuits decreases dramatically for a given power output as the output voltage decreases. Therefore, in a preferred embodiment, the diodes which act as self-commutating switches, such diodes traditionally being provided on the output side of the transformer in a transformer isolated push-pull converter, are replaced by active switches, preferably FETs driven by tertiary windings on the transformer. The current required to drive the FETs is very low and this results in very low loss.

BRIEF DESCRIPTION OF THE DRAWINGS

Certain embodiments of the invention will now be described, by way of example only, with reference to the accompanying drawings wherein.

DESCRIPTION OF THE DISCLOSED EMBODIMENTS

Figure 1:
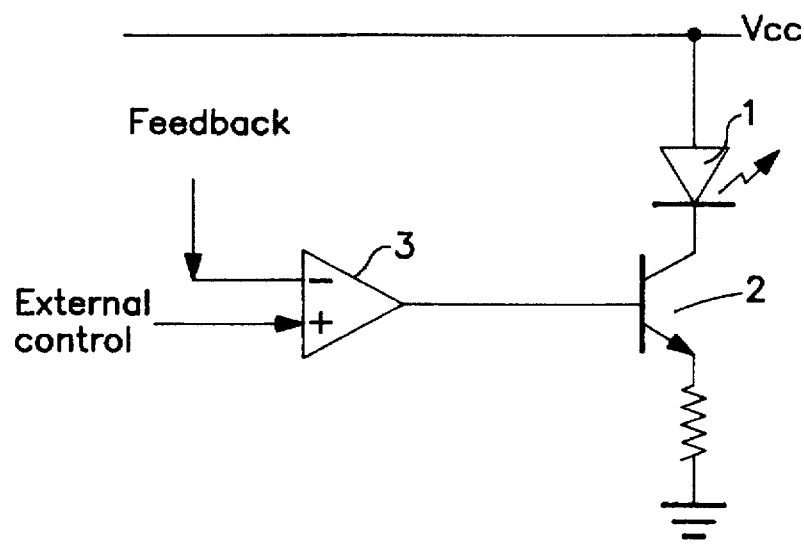
FIG. 1 shows a linear laser diode drive circuit in accordance with the prior art.
Figure 2:
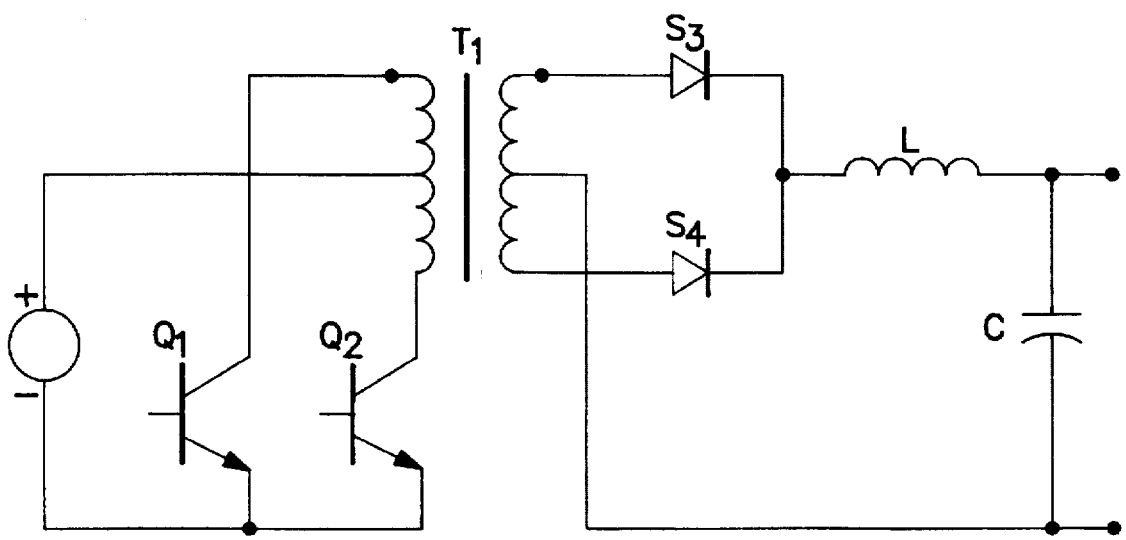
FIG. 2 shows a Buck push-pull voltage converter with an isolating transformer as used in one embodiment of the present invention.

FIG. 2 depicts a switched mode drive circuit wherein drive pulses are applied to a driven high frequency switch defined by transistors $Q_1$ and $Q_2$, which opens and closes to cause current flow alternately in opposite directions in the center-tapped primary winding of transformer $T_1$. This results in a pulsed output signal being induced in the secondary winding of transformer $T_1$. This output signal is smoothed by an LC filter circuit to provide an output signal whose amplitude is determined by the width of the input pulses. In the embodiment of FIG. 2, the smoothing circuit, i.e., the filter, is formed by inductor L and capacitor C. In the FIG. 3 embodiment, the filter circuit is defined by inductor L1 and capacitor C6. This output signal is applied across the laser diode 1. The width of the input pulses is controlled, for example in the manner shown in FIG. 1, in dependence on an external input command signal indicative of the desired output power and a feedback signal from a sensor which detects the actual output of the laser diode.

In prior art linear systems, as shown in FIG. 1, all of the supply voltage is dropped across the diode and series elements such as a transistor and a resistor. Thus if, for example, the power supply voltage was 12V and, at full power, the diode voltage was 2V and the operating current was 3 A, the overall power would be 36 W, with 30 W of that being dissipated as heat in the series element and only 6 W being useful power output from the diode. This is clearly very inefficient and also results in the series components becoming very hot and so additional cooling elements are required.

Using the present invention, almost all of the generated power is from the laser and the system is, therefore, around 90% efficient.

The use of step-down isolation transformer $T_1$ considerably increases the efficiency of a control in accordance with the present invention. In a typical circuit, as indicted on FIG. 3, the ratio of primary turns to secondary turns in 47:3 turns, for a 2 V, 3 A output derived from a direct current supply of approximately 50 V which is connected to the primary winding. In the example being described, the primary current is only about 140 mA and thus the current related losses are greatly reduced.

Figure 3:
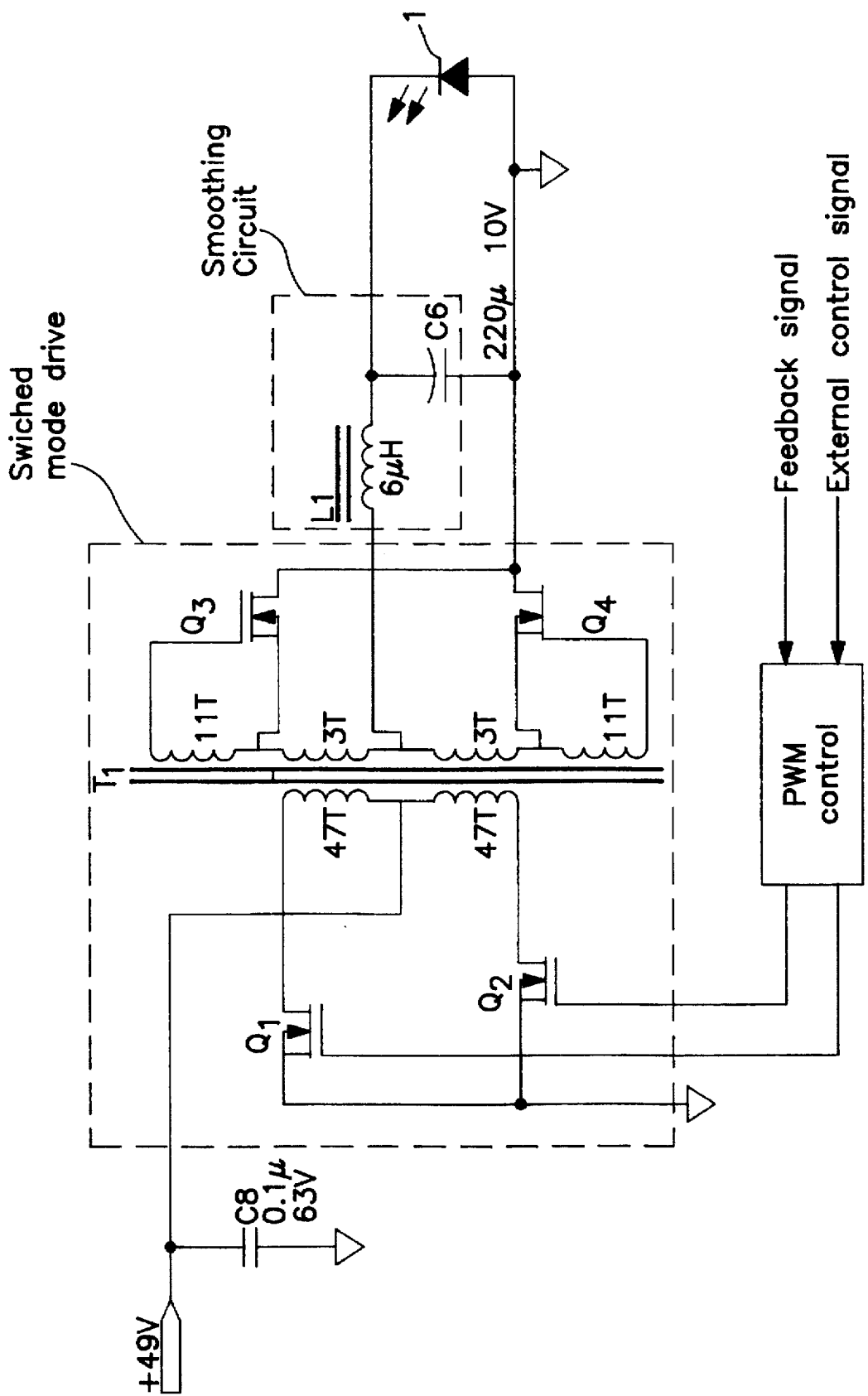
FIG. 3 shows a modified push-pull switched mode drive circuit in accordance with the preferred embodiment of the invention.

In practice a bridge rectifier (not shown) will usually be connected between the mains transformer and the switching circuit, the bridge rectifier thus comprising the 49V direct current source of FIG. 3. Without the step-down transformer $T_1$ the diode operating current, typically 3 A, would need to be supplied from the mains transformer and through the bridge rectifier diodes. Since there is a 0.7V drop across each diode in the bridge rectifier this would result in a high power loss across the rectifier. However, because the step-down transformer results in a very low current through the transformer primary winding, and thus through the rectifier, these losses are minimised. Due to the very low current, Joule losses on all the cables are also minimised.

The use of isolating transformer $T_1$ is also a safety feature which, in accordance with medical instrumentation regulations, protects against failure of any single component producing a hazardous situation.

Only A.C. power can get across the transformer. Therefore, if either of the switching transistors, $Q_1$, $Q_2$, fails, resulting in a short circuit or open circuit, no power is transferred across the transformer to the diode.

Further, the drive circuit of the present invention allows the ground reference point of the laser diode to be arbitrarily selected such that, if the transformer fails, e.g. if a short circuit occurs between the primary and secondary windings of transformer $T_1$, the laser diode will be reverse biased and thereby switched off.

In the embodiment shown in FIGS. 2 and 3, the anode of the laser diode is connected to ground. If the transformer short circuits, since all the voltages on the primary winding are positive, a positive potential will be applied to the cathode of the diode which reverse biases the laser diode.

Figure 4:
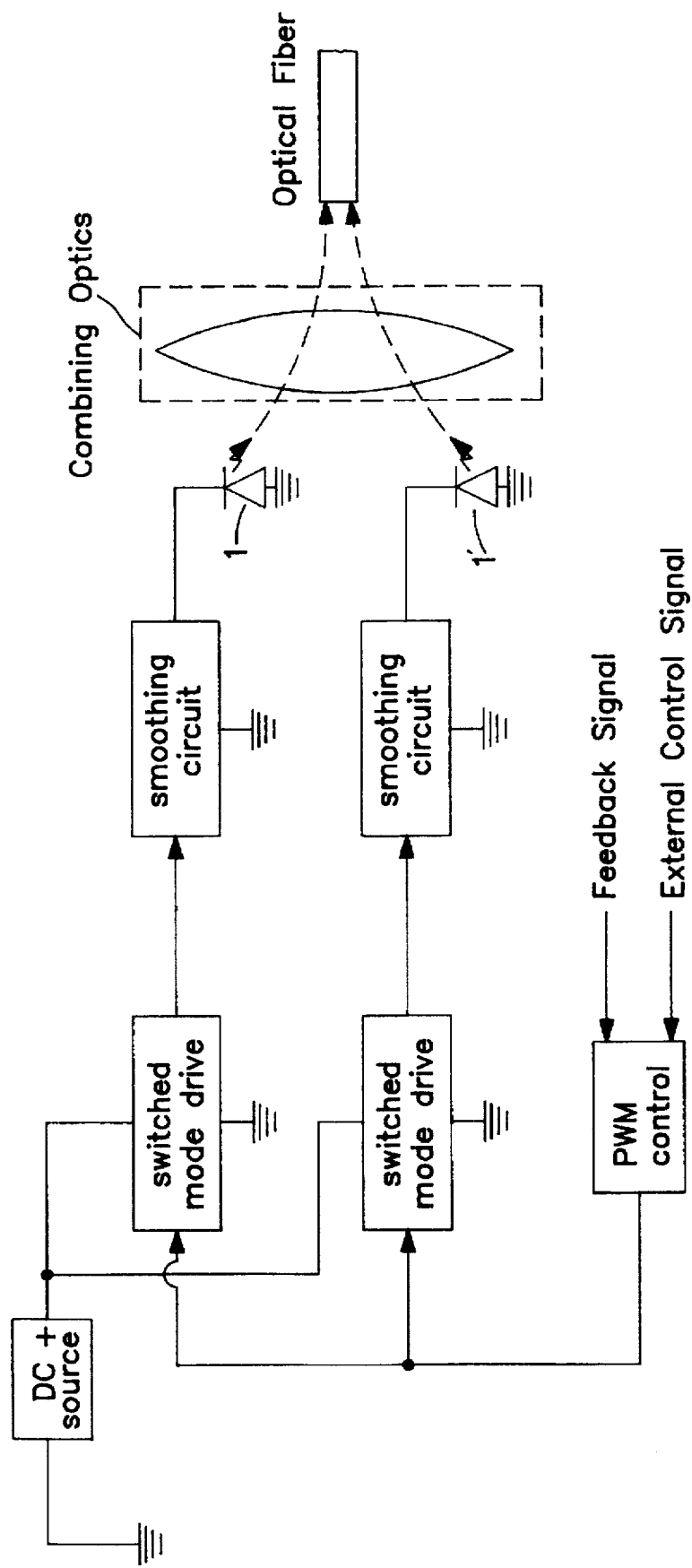
FIG. 4 schematically illustrates the use of the present invention in a system wherein the outputs of plural laser diodes are combined.

The arbitrary choice of ground potential for the diode anode voltage level also enables many laser diodes to be put in thermal and electrical contact with their anodes joined as schematically illustrated in FIG. 4.

If any of the components on the secondary side of Transformer $T_1$ fail the lasing power will be reduced and no hazard arises.

All of the above-discussed features are particularly advantageous in medical instrumentation and, since additional safety elements are not needed, the resulting package is more compact. This is an especially important consideration for drive circuits for use in the system disclosed in WO-A-92/02844 where sixteen laser diodes are mounted in a compact unit.

Although switched mode power supply topologies are known in other applications, e.g. as push-pull drive circuits for loudspeakers, they have not previously been used to drive laser diodes. One reason is that in these other applications, the circuits generally provide moderate or high (usually 5 or 12V) output voltages, and in any case not less than 5V, whereas laser diodes require a much lower control voltage, typically 2V. It has been found that the losses in such circuits increase dramatically as the voltage falls below 5V.

The switched mode power supplied shown in FIG. 2 and FIG. 3 comprises two switches for controlling current flow through the isolation transformer primary winding. In the FIG. 2 embodiment, switching transistors $Q_1$, $Q_2$ are used, and a secondary, self-commutating switch, for which diodes $S_3$, $S_4$ are used as a self-commutating switch.

The use of switched diodes, however, results in some power loss, and this can be particularly serious in the case of a laser diode which constitutes a high current lower voltage load. For example, a typical switching diode has a 0.7V drop across it. For a load which requires 10 W at 10V the current is 1 A, and the power loss across the switching diode is a relatively insignificant 0.7 W. However, for a load which requires 10 W at 1V (such as a laser diode) the current is 10 A and the power loss 7 W.

Thus, in order to minimise these losses, in the preferred embodiment of FIG. 3, the diodes $S_3$, $S_4$ are replaced with active synchronous switches, e.g. in the form of FETs $Q_3$, $Q_4$, which are driven by tertiary coils on the transformer secondary winding as pulses are applied. We have found that this arrangement dramatically reduces power loss in a laser diode drive circuit.

It is preferable to minimise switching losses as much as possible by using a low-leakage inductance transformer In the preferred embodiment the Transformer $T_1$ is formed by winding a first primary winding of bifilar wire very tightly and neatly around the core. A secondary winding is then wound over this, followed by a second primary winding and then a tertiary winding. The primary is split into two halves. Low leakage inductance is achieved by getting good coupling between the primary and secondary windings. The secondary winding should be physically close and entirely cover the primary winding. A suitable number of turns for each winding in accordance with one reduction to practice of the invention is specified by way of example in FIG. 3.

Although switched mode power supplies are known, their use in driving laser diodes, particularly in medical applications, requires special considerations as regards efficiency, size and safety as discussed above.

FIG. 4 schematically illustrates the use of the present invention in a system where a plurality of laser diodes, with common anode potential, are used in conjunction with an optical fiber, means being provided for combining the light beams produced by the individual diodes and for directing the combined beam into the optical fiber. While FIG. 4 depicts only a pair of laser diodes 1, in a medical application such as shown in above-referenced WO-2/02844, there may be a bank of sixteen diodes which are simultaneously operated to provide the requisite output power.

It will be appreciated that the illustrated embodiments are given only by way of example. Other suitable forms of switched mode power supply will be known to those of relevant skill and could be used in the invention.

We claim:

1. A switched mode drive circuit for a laser diode comprising:
   a source of direct current, said current source having terminals at different potentials;
   a step-down isolation transformer having primary and secondary windings, said primary winding being connected to a first terminal of said source;
   first switch means connected between said primary winding and a second terminal of said source for controlling current flow through said primary winding;
   means providing pulse width modulated control signals to said first switch means to cause periodic current flow from said source through said transformer primary winding whereby a pulsating voltage is induced in said transformer secondary winding;
   filter means responsive to voltage pulses applied thereto for providing a substantially constant output voltage having a magnitude dependent on the width of said applied voltage pulses;
   synchronous self-commutating switch means connected between said secondary winding of said transformer and said filter means, voltages induced in said transformer secondary winding being applied to said filter means by said synchronous switch means whereby the magnitude of said output voltage is commensurate with the width of said control signals; and
   means for delivering said filter means output voltage to a laser diode to control the coherent light generated by said laser diode.

2. The drive circuit of claim 1 wherein said filter means comprises a capacitor and an inductor.

3. The drive circuit of claim 2 wherein said transformer, first switch means, means providing pulse width modulated control signals, filter means and synchronous switch means cooperate to define a transformer isolated push-pull converter.

4. The drive circuit of claim 3 wherein said synchronous switch means comprises at least first and second field effect transistors, the switching control signals for said field effect transistors being derived from voltages induced in secondary windings of said transformer.

5. The drive circuit of claim 2 wherein said synchronous switch means comprises at least first and second field effect transistors, the switching control signals for said field effect transistors being derived from voltages induced in secondary windings of said transformer.

6. The drive circuit of claim 1 wherein said transformer, first switch means, means providing pulse width modulated control signals, filter means and synchronous switch means cooperate to define a transformer isolated push-pull converter.

7. The drive circuit of claim 6 wherein said synchronous switch means comprises at least first and second field effect transistors, the switching control signals for said field effect transistors being derived from voltages induced in secondary windings of said transformer.

8. The drive circuit of claim 1 wherein said synchronous switch means comprises at least first and second field effect transistors, the switching control signals for said field effect transistors being derived from voltages induced in secondary windings of said transformer.

9. A light source for use in conjunction with an optical fiber, said light source comprising:

a plurality of laser diodes;

means for controlling the energization of individual of said laser diodes, said energization controlling means each comprising:

a switched mode drive circuit for a laser diode comprising:

a source of direct current, said current source having terminals at different potentials;

a step-down isolation transformer having primary and secondary windings, said primary winding being connected to a first terminal of said source;

first switch means connected between said primary winding and a second terminal of said source for controlling current flow through said primary winding;

means providing pulse width modulated control signals to said first switch means to cause periodic current flow from said source through said transformer primary winding whereby a pulsating voltage is induced in said transformer secondary winding;

filter means responsive to voltage pulses applied thereto for providing a substantially constant output voltage having a magnitude dependent on the width of said applied voltage pulses;

synchronous self-commutating switch means connected between said secondary winding of said transformer and said filter means, voltages induced in said transformer secondary winding being applied to said filter means by said synchronous switch means whereby the magnitude of said output voltage is commensurate with the width of said control signals; and means for combining the light beams produced by said laser diodes and for directing the combined light beam into an optical fiber.

10. The drive circuit of claim 9 wherein said filter means comprises a capacitor and an inductor.

11. The drive circuit of claim 10 wherein said transformer, first switch means, means providing pulse width modulated control signals, filter means and synchronous switch means cooperate to define a transformer isolated push-pull converter.

12. The drive circuit of claim 11 wherein said synchronous switch means comprises at least first and second field effect transistors, the switching control signals for said field effect transistors being derived from voltages induced in secondary windings of said transformer.

13. A method for exercising control over the output power of a laser diode comprising the steps of:

generating, from a direct current source, voltage pulses having a width commensurate with the desired light output intensity of the laser diode;

producing a substantially constant voltage having a magnitude which is dependent upon the width of said generated voltage pulses;

direct current isolating said substantially constant voltage from the direct current source; and applying the substantially constant voltage across the laser diode.

14. The method of claim 13 wherein said step of producing a substantially constant voltage comprises passively filtering said generated voltage pulses.

15. The method of claim 14 wherein said step of generating voltage pulses includes synchronously switching pulses derived from a direct current to alternating current converter prior to passive filtering.

\* \* \* \* \*